United States Patent [19]

Manssen et al.

[11] Patent Number: 5,010,309

[45] Date of Patent: Apr. 23, 1991

[54] CERAMIC BLOCK FILTER WITH CO-FIRED COUPLING PINS

[75] Inventors: Keith R. Manssen, Long Grove; Michael F. Moutrie, Buffalo Grove, both of Ill.

[73] Assignee: Motorola, Inc., Schaumburg, Ill.

[21] Appl. No.: 455,725

[22] Filed: Dec. 22, 1989

[51] Int. Cl.$^5$ .............................................. H01P 1/202
[52] U.S. Cl. .................................... 333/206; 333/202; 455/82
[58] Field of Search ................. 333/202, 204, 21, 207, 333/222, 223, 230; 29/837; 455/73, 78-83

[56] References Cited

U.S. PATENT DOCUMENTS

| | | | |
|---|---|---|---|
| 4,410,868 | 10/1983 | Meguro et al. | 333/202 |
| 4,425,555 | 1/1984 | Meguro et al. | 333/202 |
| 4,450,421 | 5/1984 | Meguro et al. | 333/202 |
| 4,464,640 | 8/1984 | Nishikawa et al. | 333/202 |
| 4,745,379 | 5/1988 | West et al. | 333/202 X |
| 4,829,274 | 5/1989 | Green et al. | 333/202 |
| 4,879,533 | 11/1989 | de Muro et al. | 333/202 X |
| 4,890,079 | 12/1989 | Sasaki | 333/202 X |

FOREIGN PATENT DOCUMENTS

| | | | |
|---|---|---|---|
| 0254801 | 12/1985 | Japan | 333/202 |
| 0173503 | 8/1986 | Japan | 333/234 |
| 0050102 | 3/1988 | Japan | 333/222 |

Primary Examiner—Eugene R. LaRoche
Assistant Examiner—Seung Ham
Attorney, Agent, or Firm—Rolland R. Hackbart

[57] ABSTRACT

A ceramic block filter (100) includes coupling pins (101 and 102) disposed in holes (124 and 125) in corresponding electrodes (121 and 122) for interconnecting the filter to radio frequency devices, such as a radio transceiver. During manufacture of the filter (100), the coupling pins (101 and 102) are bonded to conductive material (131) of the holes (124 and 125) and corresponding electrodes (121 and 122) when the rest of the conductive material (160) is fired. To facilitate the electrical bond during the manufacturing process, the coupling pins (101 and 102) may be silver or silver plated and co-fired at the same time. Since the coupling pins (101 and 102) are fired at the same time as the rest of the conductive material, a reliable and inexpensive bond is achieved between the coupling pins (101 and 102) and the conductive material of the holes (124 and 125) and corresponding electrodes (121 and 122).

12 Claims, 1 Drawing Sheet

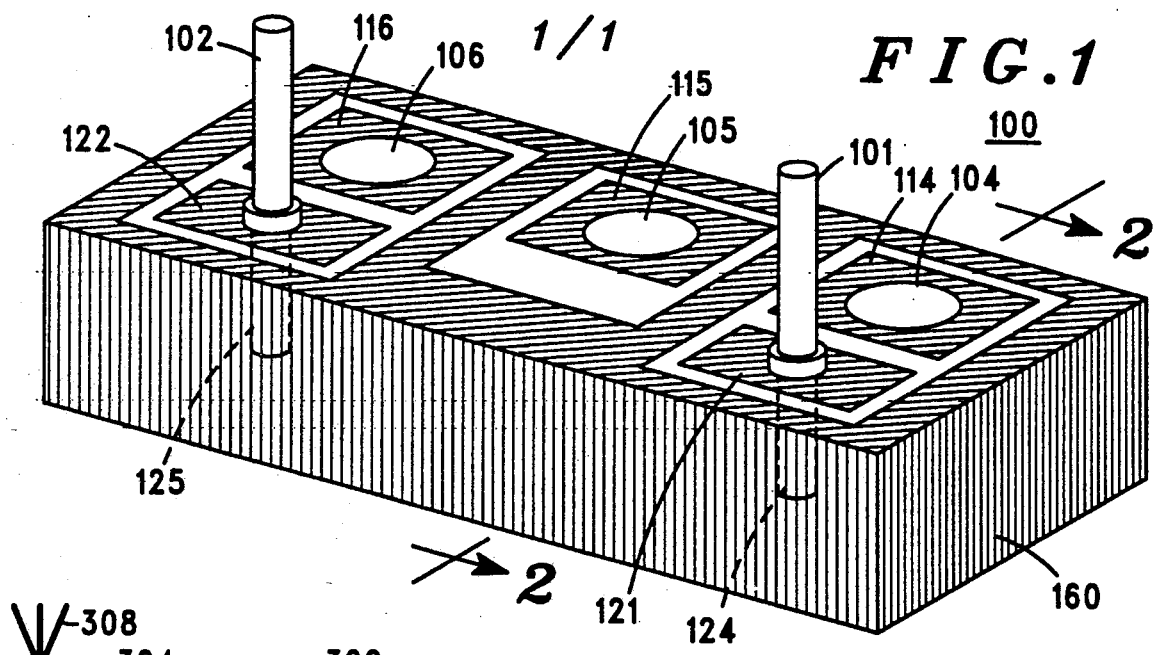
*FIG.1*
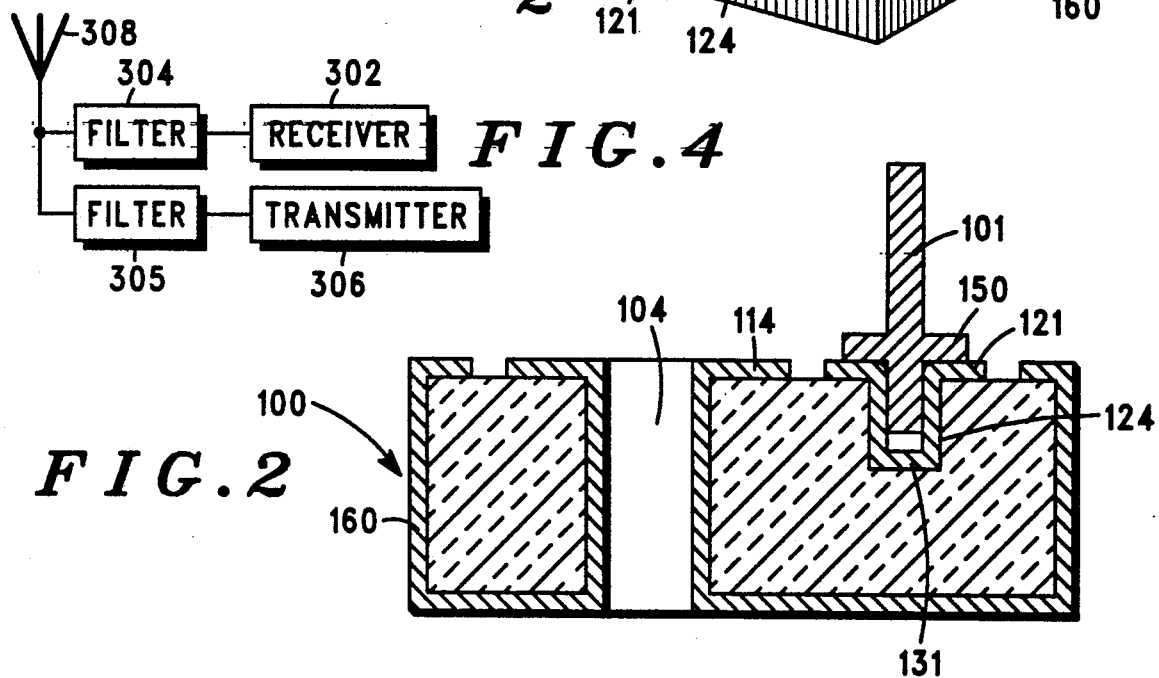
*FIG.4*
*FIG.2*
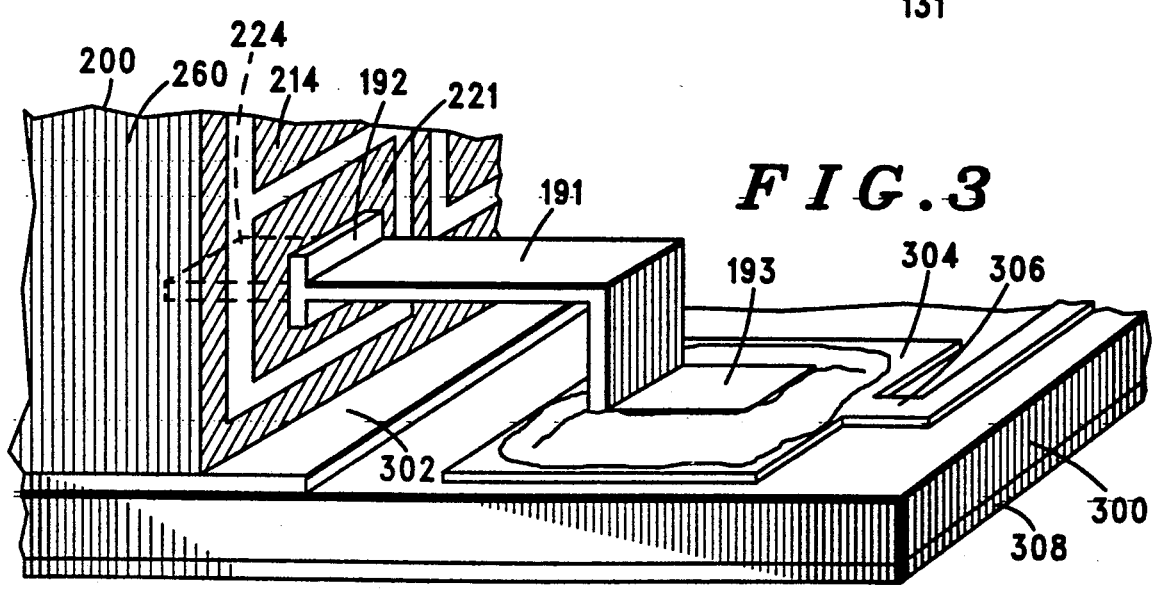
*FIG.3*

CERAMIC BLOCK FILTER WITH CO-FIRED COUPLING PINS

BACKGROUND OF THE INVENTION

The present invention relates generally to radio frequency (RF) signal filters, and more particularly to a ceramic block filter with co-fired coupling pins for interconnection to radio transceivers.

Interconnection to prior art ceramic block filters may be accomplished by integral conventional coupling connectors as shown and described in U.S. Pat. No. 4,431,977 or by integral coaxial coupling cables retained by a housing as shown and described in U.S. Pat. No. 4,742,562. However, in both of the foregoing instances coaxial cables are required for interconnection, thereby incurring additional cost.

The need for coaxial cables may be eliminated by surface mounting the filter and coupling to the resonators thereof by direct solder connection as shown and described in U.S. Pat. No. 4,673,902. However, direct solder connections to the ceramic block are subject to breakage thereby degrading quality. Alternatively, wires may be connected to the resonators as shown and described in U.S. Pat. No. 4,703,291 or to input/output pads as shown and described in U.S. Pat. No. 4,716,391. However, the use of individual wires likewise both increases the manufacturing cost and is unreliable. Therefore, there is need to reliably and inexpensively couple to ceramic block filters.

OBJECTS OF THE INVENTION

Accordingly, it is an object of the present invention to provide an improved dielectric block filter that includes co-fired coupling pins for interconnection thereto.

It is another object of the present invention to provide an improved dielectric block filter including co-fired coupling pins, which may be surface mounted and reliably interconnected by way of the co-fired coupling pins.

BRIEF DESCRIPTION OF THE DRAWINGS

FIG. 1 is a perspective view of a ceramic block filter embodying the present invention.

FIG. 2 is a cross sectional view of the ceramic block filter in FIG. 1 taken along lines 2—2.

FIG. 3 is a partial perspective view of another ceramic block filter embodying the present invention.

FIG. 4 is a block diagram of a radio transceiver including ceramic block filters of the present invention for coupling the transmitter and receiver thereof to a common antenna.

DETAILED DESCRIPTION OF THE PREFERRED EMBODIMENT

Referring to FIG. 1, there is illustrated a perspective view of a block filter 100 embodying the present invention. Filter 100 is a dielectric block filter preferably comprised of a high-dielectric low-loss ceramic, such as those ceramics described in U.S. Pat. Nos. 3,938,064 and 4,431,977. Filter 100 includes coupling pins 101 and 102 for interconnection to radio frequency (RF) circuitry of a conventional radio transceiver, such as the transceiver shown and described in Motorola instruction manual number 68P81070E40, entitled "DYNA-TAC cellular Mobile Telephone," published by and available from Motorola C & E Parts, 1313 East Algonquin Road, Schaumburg, Ill. 60196. As illustrated in FIG. 4, ceramic block filters 304 and 305 of the present invention may couple RF receiver 302 and RF transmitter 306, respectively, to a common antenna 308 of a radio transceiver.

Filter 100 includes three holes 104, 105 and 106 extending from the top surface to the bottom surface thereof. Although filter 100 is shown having three holes 104, 105 and 106, any number of one or more holes may be used in filters embodying the present invention. The bottom and sides of filter 100 and internal surfaces of holes 104, 105 and 106 are covered with conductive material 160 over substantially their entire surfaces. The top surface of filter 100 is covered by strips of conductive material 160 near the periphery thereof and between holes 104, 105 and 106, which is electrically connected to the conductive material 160 on the side surfaces of filter 100. Also disposed on the top surface of filter 100 are resonator electrodes 114, 115 and 116 and coupled electrodes 121 and 122. Electrodes 114, 115 and 116 are comprised of conductive material and electrically connected to the conductive material of holes 104, 105 and 106, respectively. Electrodes 121 and 122 are likewise comprised of conductive material and electrically connected to coupling pins 101 and 102, respectively.

Holes 104, 105 and 106 form transmission line resonators which may be tuned by removing conductive material from electrodes 114, 115 and 116, respectively, or from the surrounding conductive material 160. Holes 104, 105 and 106 have a substantially circular cross section, although other shapes may be used, such as, for example, a rectangular cross section with rounded corners and parallel elongated sides. The electrodes 114, 115 and 116 for holes 104, 105 and 106 may have varying shapes for capacitively coupling to the surrounding conductive material 160. The amount of capacitive coupling between electrodes 114, 115 and 116 and the surrounding conductive material 160 can be varied by decreasing or increasing the gap between electrodes 114, 115 and 116 and the surrounding conductive material 160, by varying the size of electrodes 114, 115 and 116, or by any other suitable means. Each of the holes 104, 105 and 106 functions essentially as a foreshortened transmission line resonator. The conductive material 160 covering the surfaces of filter 100 is preferably thick-film silver, and may also be thick-film copper or any other suitable material exhibiting good conductivity.

According to the present invention, coupling pins 101 and 102 of filter 100 are disposed in holes 124 and 125 in electrodes 121 and 122, and bonded at least to the conductive material of holes 124 and 125, respectively. Coupling pins 101 and 102 include circular portion 150 (see FIG. 2) for both bonding to electrodes 121 and 122 and limiting the distance which they extend into holes 124 and 125, respectively. To facilitate the electrical bond during the manufacturing process, pins 101 and 102 may be comprised of the same material as conductive material 160, i.e. preferably silver or silver plated, and co-fired at the same time. Electrodes 121 and 122 capacitively couple pins 101 and 102 to electrodes 114 and 116, respectively. The amount of capacitive coupling provided by electrodes 121 and 122 can be varied by decreasing or increasing the gap between electrodes 121 and 122 and electrodes 114 and 116, respectively, by varying the size of the opposing edges of electrodes 121 and 122 and electrodes 114 and 116, respectively, or by any other suitable means. Although shown with two coupling pins 101 and 102, only one coupling pin need be used in practicing the present invention.

The manufacturing process for filter 100 includes at least the following four steps. First, the step of producing holes 124 and 125 is performed at the same time holes 104, 105 and 106 are formed. This step occurs during the ceramic powder pressing and molding process. The formed powder block is then fired at high temperature. Next, the step of selectively covering with conductive film 160 the bottom and side surfaces of the ceramic block, the surfaces of the holes 104, 105, 106 124 and 125, and the surface area for electrodes 114, 115, 116, 121 and 122 is performed. The conductive film used is preferably a thickfilm silver ink that is either painted, screened or sprayed onto the ceramic block. Then, the step of inserting silver coupling pins 101 and 102 in holes 124 and 125, respectively, is performed. Lastly, the step of firing the ceramic block at high temperature is performed for bonding or co-firing the conductive film 160 thereto and coupling pins 101 and 102 to the conductive film in holes 124 and 125, respectively. According to the present invention, the foregoing process produces an intimate and reliable bond between coupling pins 101 and 102 and the conductive film in holes 124 and 125, respectively.

Referring next to FIG. 2, there is illustrated a cross sectional view of the ceramic block filter 100 in FIG. 1 taken along lines 2—2 through coupling pin 101, hole 124, electrode 121, electrode 114 and hole 104. Coupling pin 101 extends into hole 124, which is covered with conductive material 131. Conductive material 131 of hole 124 is connected to the conductive material of electrode 121. During manufacture of filter 100, pin 101 is bonded to conductive material 131 and 121 when the rest of the conductive material 160 is fired. Therefore, according to the present invention, a reliable and inexpensive bond is achieved between coupling pins 101 and 102 and the conductive material of holes 124 and 125 and electrodes 121 and 122, respectively.

Referring next to FIG. 3, there is illustrated a partial perspective view of another ceramic block filter 200 embodying the present invention. Filter 200 includes at least one coupling pin 191 which has a rectangular cross section. Pin 191 inserts into hole 224 which likewise has a rectangular cross section. Pin 191 is bonded to the conductive material of hole 224 and electrode 221 during the co-firing process. According to a novel feature of the present invention, pin 191 includes a foot portion 193 which enables filter 200 to be mounted on a printed circuit board 300. The conductive material 260 on the side surface of filter 200 is soldered to pad 302 of circuit board 300, and foot portion 193 is soldered to pad 304 of transmission line 306. As a result, filter 200 may be used in applications where a surface-mount filter component is desired. Cylindrical coupling pins 101 and 102 in FIG. 1 may also include foot portions similar to foot portion 193 of filter 200.

In summary, a unique dielectric block filter has been described which includes at least one co-fired coupling pin for reliable and inexpensive interconnection to RF devices, such as radio transceivers. The coupling pin may be formed with a foot portion so that the unique dielectric block filter may be surface mounted on a printed circuit board. The unique dielectric block filter of the present invention may be advantageously utilized in any application where RF filtering is desired.

We claim:

1. A filter, comprising:
a dielectric block having top, bottom and side surfaces and having at least first and second holes each extending from the top surface toward the bottom surface, said bottom and said surfaces and said first and second holes being substantially covered with a conductive material for producing producing first and second transmission line resonators;

first resonator electrode means disposed on the top surface of said dielectric block and connected to the conductive material of said first hole;

second resonator electrode means disposed on the top surface of said dielectric block and connected to the conductive material of said second hole;

first coupling electrode means disposed on the top surface of said dielectric block for capacitively coupling to said first resonator electrode means of said first hole, said first coupling electrode means including a hole having surfaces covered with a conductive material;

second coupling electrode means disposed on the top surface of said dielectric block for capacitively coupling to said seccnd resonator electrode means of said second hole, said second coupling electrode means including a hole having surfaces covered with a conductive material;

a first coupling pin having a portion disposed in the hole in said first coupling electrode means;

a second coupling pin having a portion disposed in the hole in said second coupling electrode means; and said conductive material and said first and second coupling pins having been simultaneously co-fired for bonding said conductive material to said dielectric block, for bonding said first coupling pin to the conductive material of said first coupling electrode means and hole in said first coupling electrode means, and for bonding said second coupling pin to the conductive material of said second coupling electrode means and hole in said second coupling electrode means.

2. The filter of claim 1, wherein said first and second coupling pins are comprised of a conductive material.

3. The filter of claim 1, wherein said first and second coupling pins are plated with silver.

4. The filter according to claim 1, wherein said first and second coupling pins each comprise a strip electrode having a substantially rectangular cross section, and said hole in said first coupling electrode means and said hole in said second coupling electrode means both have a substantially rectangular cross section for receiving said first and second coupling pins, respectively.

5. A radio transceiver, comprising:
an antenna;
a transmitter having an output; and
filtering means for coupling said transmitter to said antenna, comprising:
a dielectric block having top, bottom and side surfaces and having at least first and second holes each extending from the top surface toward the bottom surface, said bottom and side surfaces and said first and second holes being substantially covered with a conductive material for producing first and second transmission line resonators;

first resonator electrode means disposed on the top surface of said dielectric block and connected to the conductive material of said first hole;

second resonator electrode means disposed on the top surface of said dielectric block and connected to the conductive material of said second hole;

first coupling electrode means disposed on the top surface of said dielectric block for capacitively coupling to said first resonator electrode means of said first hole, said first coupling electrode means including a hole having surfaces covered with a conductive material;

second coupling electrode means disposed on the top surface of said dielectric block for capacitively coupling to said second resonator electrode means of said second hole, said second coupling electrode means including a hole having surfaces covered with a conductive material;

a first coupling pin having a portion disposed in the hole in said first coupling electrode means;

a second coupling pin having a portion disposed in the hole in said second coupling electrodes; and said conductive material and said first and second coupling pins having been simultaneously co-fired for bonding said conductive material to said dielectric block, for bonding said first coupling pin to the conductive material of said first coupling electrode means and hole in said first coupling electrode means, and for bonding second coupling pin to the conductive material of said second coupling electrode means and hole in said second coupling electrode means.

6. The filter of claim 5, wherein said first and second coupling pins are comprised of a conductive material.

7. The filter of claim 5, wherein said first and second coupling pins are plated with silver.

8. The filter according to claim 5, wherein said first and second coupling pins each comprise a strip electrode having a substantially rectangular cross section, and said hole in said first coupling electrode means and said hole in said second coupling electrode means both have a substantially rectangular cross section for receiving said first and second coupling pins, respectively.

9. A radio transceiver, comprising:
an antenna;
a receiver having an input; and
filtering means for coupling said receiver to said antenna, comprising:
a dielectric block having top, bottom and side surfaces and having at least first and second holes extending from the top surface toward the bottom surface, said bottom and said side surfaces and said first and second holes being substantially covered with a conductive material for producing first and second transmission line resonators;

first resonator electrode means disposed on the top surface of said dielectric block and connected to the conductive material of said first hole;

second resonator electrode means disposed on the top surface of said dielectric block and connected to the conductive material of said second hole;

first coupling electrode means disposed on the top surface of said dielectric block for capacitively coupling to said first resonator electrode means of said first hole, said first coupling electrode means including a hole having surfaces covered with a conductive material;

second coupling electrode means disposed on the top surface of said dielectric block for capacitively coupling to said second resonator electrode means of said second hole, said second coupling electrode means including a hole having surfaces covered with a conductive material;

a first coupling pin having a portion disposed in the hole in said first coupling electrode means;

a second coupling pin having a portion disposed in the hole in said second coupling electrode means; and said conductive material and said first and second coupling pins having been simultaneously co-fired for bonding said conductive material to said dielectric block, for bonding said first coupling pin to the conductive material of said first coupling electrode means and hole in said first coupling electrode means, and for bonding second coupling pin to the conductive material of said second coupling electrode means and hole in said second coupling electrode means.

10. The filter of claim 9, wherein said first and second coupling pins are comprised of a conductive material.

11. The filter of claim 9, wherein said first and second coupling pins are plated with silver.

12. The filter according to claim 9, wherein said first and second coupling pins each comprise a strip electrode having a substantially rectangular cross section, and said hole in said first coupling electrode means and said hole in said second coupling electrode means both have a substantially rectangular cross section for receiving said first and second coupling pins, respectively.

* * * * *